(12) United States Patent
Houge et al.

(10) Patent No.: US 6,727,720 B2
(45) Date of Patent: Apr. 27, 2004

(54) PROBE HAVING A MICROSTYLET

(75) Inventors: Erik C. Houge, Orlando, FL (US);
Ryan K. Maynard, Orlando, FL (US);
John M. McIntosh, Orlando, FL (US);
Larry E. Plew, St. Cloud, FL (US);
Jeffrey B. Bindell, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 199 days.

(21) Appl. No.: 09/941,085

(22) Filed: Aug. 28, 2001

(65) Prior Publication Data
US 2003/0042922 A1 Mar. 6, 2003

(51) Int. Cl.[7] .......................... G01R 31/02; H01L 29/40
(52) U.S. Cl. ................. 324/761; 324/754; 257/734
(58) Field of Search ................. 324/761, 750, 324/754–756, 158.1; 439/482; 257/734

(56) References Cited

U.S. PATENT DOCUMENTS 5,457,343 A * 10/1995 Ajayan et al. ............... 257/734
6,020,747 A * 2/2000 Bahns et al. ................ 324/754

* cited by examiner

*Primary Examiner*—David A. Zarneke
*Assistant Examiner*—Paresh Patel

(57) ABSTRACT

A probe comprising a probe body having a body longitudinal axis and a shoulder, and a microstylet mechanically coupled to the shoulder, and a method of manufacturing the same. The microstylet extends from the shoulder and has a microstylet longitudinal axis coincident the body longitudinal axis with the microstylet having a cross section substantially smaller than a cross section of the probe body.

11 Claims, 3 Drawing Sheets

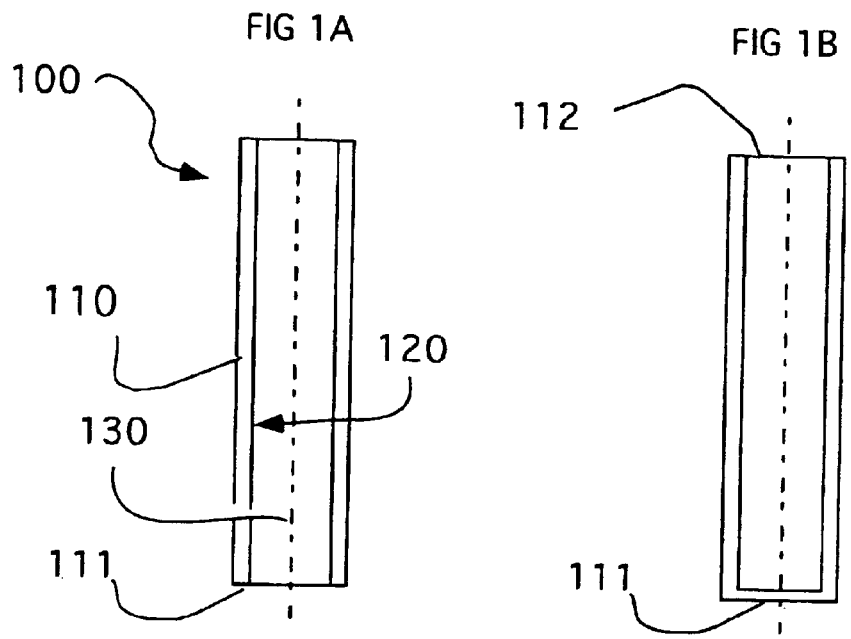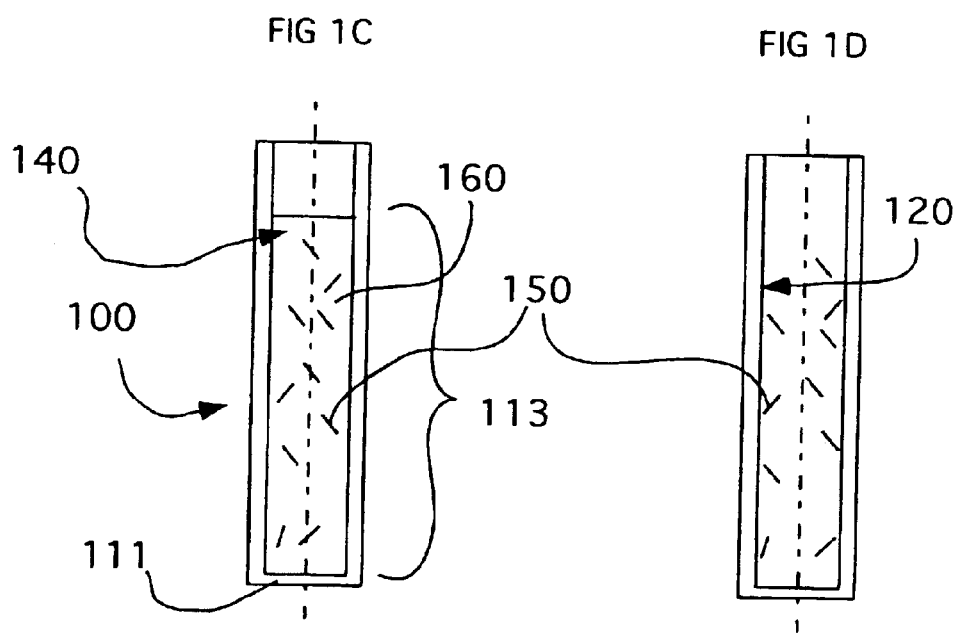

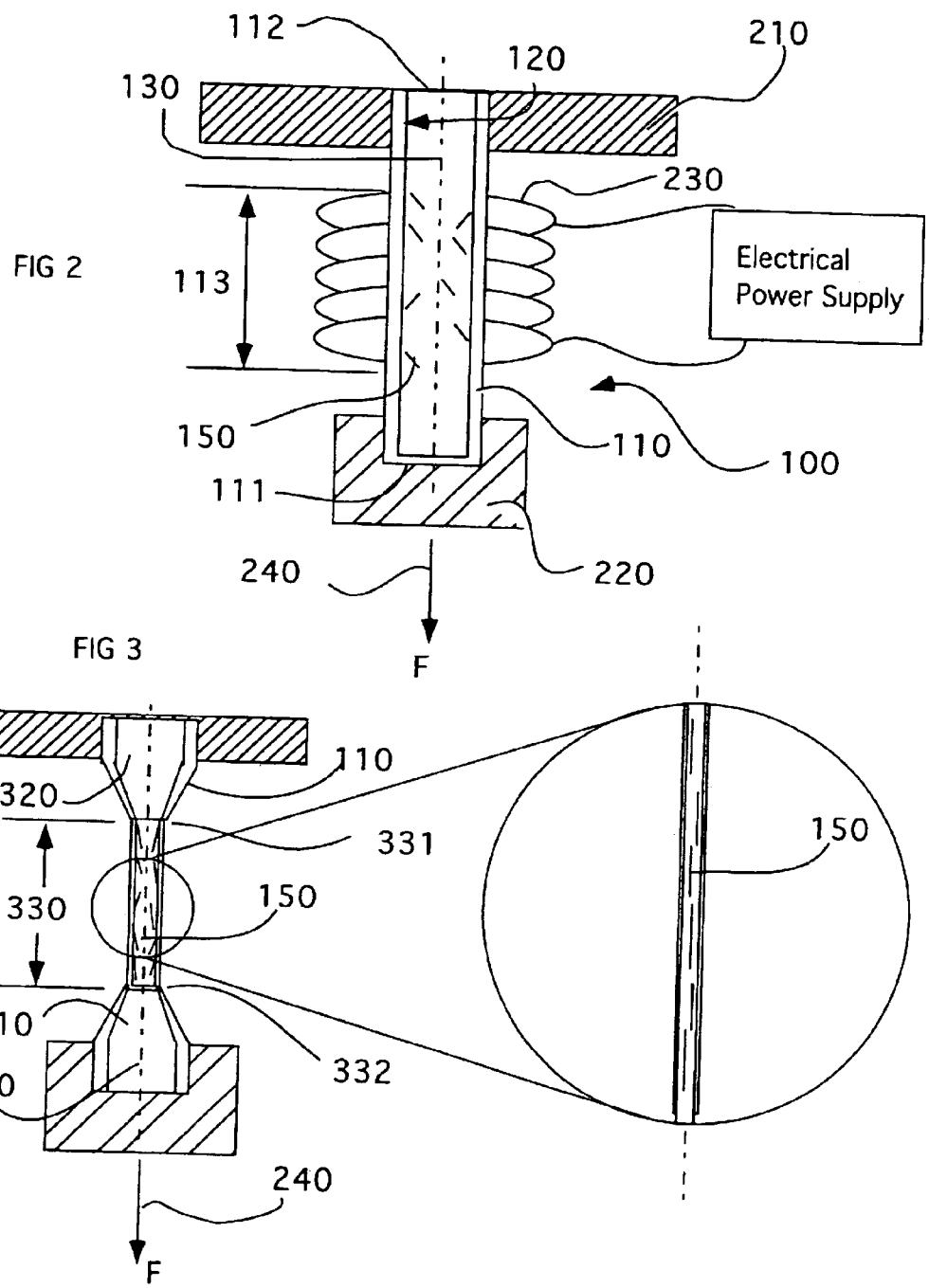

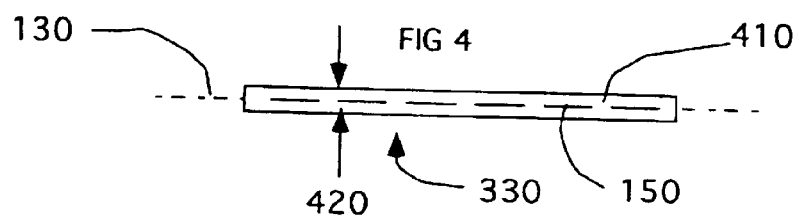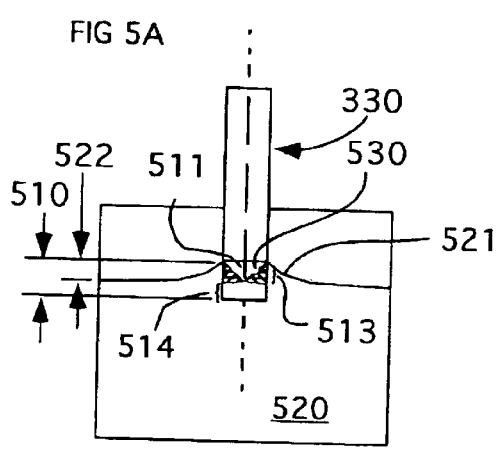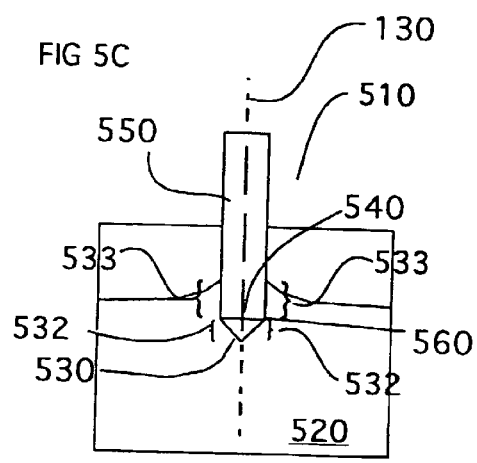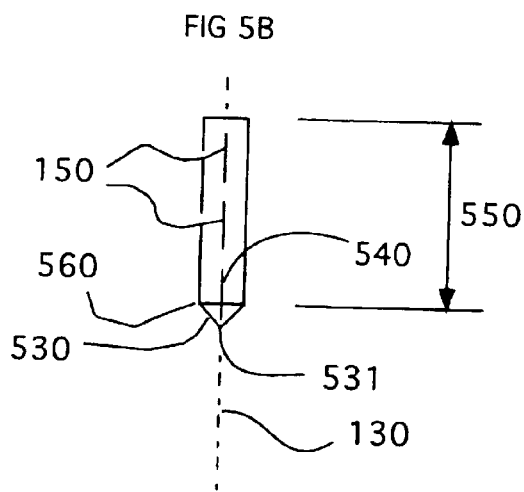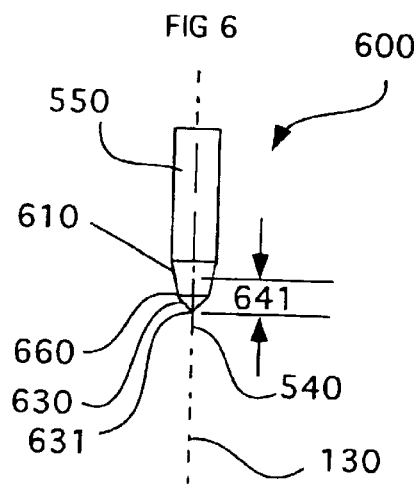

PROBE HAVING A MICROSTYLET

TECHNICAL FIELD OF THE INVENTION

The present invention is directed, in general, to integrated circuit metrology and, more specifically, to a probe having a nanotube stylet and to a method of manufacturing and mounting same for use in integrated circuit metrology.

BACKGROUND OF THE INVENTION

A conventional stylus nanoprofilometer employing a probe stylet of quartz or diamond may be used to measure integrated circuit features down to approximately 100 nm line width. However, below 100 nm line width features, i.e., at about 80 nm, problems are encountered that are aggravated by the length and diameter of the probe stylet. A conventional quartz stylus has a Young's Modulus of Elasticity of approximately 70 gigapascals (GPa) [1 GPa=1×10$^9$ Pa]. As feature sizes continue to shrink, the l$^3$/r$^4$ portion of the deflection equation degrades, forcing a major change in the Young's Modulus required of the material being used.

One promising material form that could substitute for quartz, yet has a higher Young's Modulus than quartz, is the carbon nanotube. Carbon nanotubes were discovered in 1986 as a discharge material byproduct from a carbon arc. They are actually sheets of graphite where opposing edges have become attached to each other creating a tube. They have exhibited extraordinary material properties including a Young's Modulus approaching a terapascal, i.e., 1 terapascal=1000 Gpa=1×10$^{12}$ Pa. However, no material is problem free, and in the case of carbon nanotubes, the problems are associated with orienting and manipulating them due to their extremely small size. While carbon nanotubes may range from approximately 5 nm to 100 nm in diameter and from about 500 nm to about 5000 nm in length or longer, by their very size, manipulating and orienting them becomes a problem.

Nanotube material is now commercially available having diameters of ranging from about 10 nm to about 80 nm. A diameter nominally smaller than the feature size is preferable for probe stylets. Slightly larger or smaller diameter nanotubes can also be used depending upon the semiconductor technology, i.e., feature sizes of 160 nm, 120 nm, or 100 nm, etc., being investigated. Carbon nanotubes are extremely hard to manipulate and therefore, to orient, to tolerances within less than about 10 degrees to 20 degrees of the angle desired. While some efforts have been made to use a carbon nanotube as a probe tip for atomic force microscopes, all nanotube-based probes have heretofore been manufactured by attaching a carbon nanotube to an existing probe body by fastening the nanotube tip with an adhesive to the probe body tip. The method, in some cases consists of projecting the nanotubes against a probe body tip and literally hoping that one sticks in the correct orientation. The problem with this procedure is clearly in orientation, reproducibility and cost. For integrated circuit metrology, this is totally unacceptable due to common features having sidewalls within 1 degree of normal.

Accordingly, what is needed in the art is an alternative probe having a microstylet suitable for measuring semiconductor features having on the order of 160 nm or less line widths, and a method of manufacturing the probe.

SUMMARY OF THE INVENTION

To address the above-discussed deficiencies of the prior art, the present invention provides a probe comprising a probe body having a body longitudinal axis and a shoulder, and a microstylet mechanically coupled to the shoulder, and a method of manufacturing the same. In a preferred embodiment, the microstylet extends from the shoulder and has a microstylet longitudinal axis coincident the body longitudinal axis with the microstylet having a cross section substantially smaller than a cross section of the probe body.

Therefore, the present invention incorporates the positive attributes of a material having a higher Young's Modulus and extremely small diameter, while dispensing with the problems of manipulating and attaching such a small particle to a probe body in an exact orientation.

The foregoing has outlined preferred features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion.

FIG. 1A illustrates an elevation view of one embodiment of a tube preparatory to forming a probe body of a probe manufactured according to the principles of the present invention;

FIG. 1B illustrates the tube of FIG. 1A with one end sealed and an opposite end open;

FIG. 1C illustrates a suspension of microstylets in a menstruum in the tube of FIG. 1B;

FIG. 1D illustrates the tube of FIG. 1B, at least a portion of which was filled with the suspension as shown FIG. 1C, after evaporation of the menstruum;

FIG. 2 illustrates the tube of FIG. 1D preparatory to drawing;

FIG. 3 illustrates the resultant tube after drawing and just before tube collapse;

FIG. 4 illustrates the necked portion of FIG. 3 after collapse of the tube;

FIG. 5A illustrates an elevational view of the shank being subjected to a chemical etchant for a first etch;

FIG. 5B illustrates an elevational view of the shank after the first etch;

FIG. 5C illustrates an elevational view of the probe body being subjected to a chemical etchant for a second etch; and FIG. 6 illustrates an elevational view of a completed probe manufactured according to the principles of the present invention.

DETAILED DESCRIPTION

Referring initially to FIG. 1A, illustrated is a sectional elevation view of one embodiment of a tube 100 preparatory to forming a probe body of a probe manufactured according to the principles of the present invention. In an advantageous embodiment, the tube 100 comprises a glass tube 110 having an inner wall 120 and a longitudinal axis 130. However, other non-glass materials may also be used in place of the glass tube 110. The glass tube 110 is prepared by sealing an end 111, preferably by melting the glass. A melting point tube may work well, as will a pulled pipet or a small capillary tube. FIG. 1B illustrates the tube 110 of FIG. 1A with the end 111 sealed and an opposite end 112 open. The tube 100 is therefore suitable to hold a liquid with particulate matter, i.e., microstylets, in suspension. FIG. 1C illustrates a suspension 140 of microstylets 150 in a menstruum 160 in the tube 100 of FIG. 1B. In a preferred embodiment, the microstylets 150 are carbon nanotubes. More specifically, the carbon nanotubes may be either single-walled carbon nanotubes or multi-walled carbon nanotubes. Alternatively, the microstylets 150 may be acerate microparticles 150 such as: carbon whiskers, metal needles, or diamond. Tungsten needles are among suitable metal needles available.

In a particularly advantageous embodiment, multi-walled carbon nanotubes are used as the acerate microstylets 150 because of their size and Young's Modulus. Base carbon nanotube material is now commercially available and multiwalled carbon nanotubes with a diameter of approximately 60 nm to 80 nm may work particularly well for the present invention. Slightly larger or smaller nanotubes may be used depending upon the semiconductor line widths, e.g., 160 nm, 120 nm, 100 nm, etc. It should be noted that commercially available, multi-walled, carbon nanotubes come in bundles that must be separated before used as set forth herein.

The suspension 140 is prepared by adding the commercial carbon nanotube bundles to the menstruum 160. The menstruum 160 is selected from among liquids that: (a) evaporate quickly, (b) are extremely clean, and (c) will not damage the carbon nanotube structure itself. Suitable menstrua may include low carbon number alcohols, e.g., methyl alcohol, ethyl alcohol and isopropyl alcohol. The microstylets 150 are placed in suspension in the menstruum 160 so that separation into individual microstylets 150 can occur. Dilution of the menstruum 160 by volume will help to decrease the concentration of the mirostylets 150. After preparing the suspension 140, it is poured into the hollow glass tube 110 sealed at one end 111 as shown in FIG. 1C.

Referring now to FIG. 1D, illustrated is the tube 110 of FIG. 1B, at least a portion 113 of which was filled with the suspension 140 as shown FIG. 1C, after evaporation of the menstruum 160. The menstruum 160 chosen because of its highly volatile nature, evaporates quickly. As the menstruum 160 evaporates, the microstylets 150 which are not soluble in the menstruum 160 attach to the inner wall 120 of the glass tube 110, leaving the condition illustrated in FIG. 1D. Of course, each of the microstylets 150 will attach themselves randomly to some point on the inner wall 120.

Referring now to FIG. 2, illustrated is the tube 100 of FIG. 1D preparatory to drawing of the tube as further described. The open end 112 of the tube 110 is secured to a fixed location 210, preferably a bench or other substantially fixed object, and a free weight 220, or other device that may exert a pulling force against tube 110, such as a person's hand, is attached to the closed end 111. Heat is applied to the portion 113 of the tube 110 wherein the microstylets 150 are attached to the inner wall 120. Heat may be applied using a circular filament 230 located circumferentially about the tube 110 at the portion 113 having microstylets 150 therein. Using gravity to an advantage, the tube 110 is axially loaded with the free weight 220 applying a force F along the tube longitudinal axis 130 while heat is applied proximate the portion 113. Heat is applied until the combination of heat and longitudinal force F causes the glass tube 110 to be drawn and necked at the portion 113. The portion 113 proximate the circular filament 230 will decrease in diameter as the heat and force F are continuously applied until of the tube 110 collapses on itself in that portion 113. One who is skilled in the art is familiar with the process of heating and drawing glass tubing into a capillary or pipette and the ultimate result of the radial collapse of the tube on itself.

Referring now to FIG. 3, illustrated is the resultant tube 110 after drawing and just before tube collapse. As the glass tube 110 of FIG. 2 is heated, the microstylets 150 attached to the inner wall 120 become embedded in the viscous, semifluid glass of the glass tube 110. When heated and combined with the axial force F, the longitudinal axes of the microstylets 150 align with the pulling direction 240, that also coincides with the longitudinal axis 130 of the glass tube 110. It is important that this heating and drawing process not be continued to the point at which the tensile strength of the tube 110 in its semifluid state is exceeded. The objective is to narrow the tube 110 and to therefore align the microstylets 150 with the longitudinal axis 130 of the tube 110 without breaking the tube 110. The tube 110 now comprises first and second tubular portions 310, 320 and a necked portion 330. Microstylets 150 in the necked portion 330 are aligned with the longitudinal axis 130 of the tube 110. The necked portion 330 is then purposely fractured at points 331 and 332.

Referring now to FIG. 4, illustrated is the necked portion 330 of FIG. 3 after collapse of the tube 110. In a preferred embodiment, the necked portion 330 comprises solid amorphous glass 410 on the order of 50,000 nm to 200,000 nm in diameter 420 wherein there are embedded microstylets 150 spaced apart along the longitudinal axis 130 as a function of the previously described pulling process. That is, the microstylets 150 become integrally bound to the glass 410, in contrast to the prior art that has sought to adhesively bond nanotubes to a probe body. One of the microstylets 150 will form a microstylet that is substantially smaller in cross section than the necked portion 330 that will be used as a shank 330 for a microprobe to be completed in accordance with the principles of the present invention. A microprobe is defined as a probe that is revealed by or has its structure discernible only by microscopic examination.

For the purpose of this discussion, isotropy is the property of the material, e.g., glass, to etch at the same uniform rate in all axes when subjected to a chemical etchant. Referring now to FIG. 5A, illustrated is a sectional elevational view of the shank 330 being subjected to a chemical etchant 510 for a first etch.

As a basis for the etchant, a basic oxide etchant (BOE) is prepared that, may comprise in parts by volume for example:

615 parts ammonium fluoride ($NH_4F$), 104 parts hydrofluoric acid (HF) (49%), and 62 parts deionized water ($H_2O$).

In addition to the BOE, the chemical etchant 510 may further comprise hydrofluoric acid, distilled water and acetone in ratio concentrations to control the etch rate. A typical solution chemistry for the chemical etchant may comprise, for example:

5 parts BOE, 5 parts hydrofluoric acid (HF) (49%), 1 part distilled water ($H_2O$), and 1 part acetone ($CH_3COCH_3$).

Of course, various formulations may be employed with varying results; that is, the rate of etch may be controlled by the etchant formulation and concentration. The etchant detailed above is suitable for etching when the shank 330 is glass. In those embodiments where the shank 330 is comprised of a non-glass material, etching chemistries appropriate for those materials should be used. The above formulation has been successfully used to complete the first chemical etch of the shank 330. In the case of this etchant, a typical fast radial etch rate of about 45 nm/sec and slow etch rate of about 1 nm/sec have been achieved.

When a portion 510 of the shank 330 is placed in the etchant solution 520, a meniscus 521 forms about the shank 330. The purpose of the first chemical etch is to create a region 511 that has a taper proportional to a height 522 of the meniscus 521. As a function of the concentration of the etchant 520, thicker etchant causes more extensive etching. Therefore, in area 513, where the etchant 520 is thinner, less chemical action occurs, while in area 514, where the etchant 520 is thicker, more etching action occurs, resulting in a morphology that is a right circular cone as indicated by surface 530.

Referring now to FIG. 5B, illustrated is an elevational view of the shank 330 after the first etch. Thus, the result of the first chemical etch is a tapered cone 530 located about a central axis 130 wherein spaced apart microstylets 150 are located along the central axis 130. A specific microstylet 540 within the apex 531 of the cone 530 now becomes the microstylet that will be exposed by a second etch. A main portion 550 of the shank 330, not etched by the etchant 520, may now be referred to as a probe body 550. The transition from the probe body 550 to the cone 530 forms a shoulder 560.

Referring now to FIG. 5C, illustrated is a sectional elevational view of the probe body 550 being subjected to a chemical etchant 510 for a second etch. Once the tapered conical shape 530 has been formed, a greater portion of the probe body 550 including the conical shape 530 is placed in the etchant 520. As the etchant continues to etch the glass isotropically, material is removed from the probe body 550 and the conical shape 530 at areas 532 and 533. As before, the etching results in a conical shape about the central axis 130. Again, in area 533, where the etchant 520 is thinner, less chemical action occurs, while in area 532, where the etchant 520 is thicker, more etching action occurs.

Referring now to FIG. 6, illustrated is a sectional elevational view of a completed probe 600 manufactured according to the principles of the present invention. The probe body 550, subjected to a thinner etch in area 533 has not etched as much as area 532 where the etchant 520 was thicker. This difference in etching rates has resulted in a morphology that is a tapering, right circular cylinder 610. However, because the glass material of the conical shape 530 comprises less mass than the probe body 550, the shoulder 560 (FIG. 5C) decreases in circumference as the etch proceeds reforming the shoulder 560. The transition from the surface 610 to a new conical shape 630 demarks a transition from a conical slope of one portion 610 to a conical slope of a second portion 630. This transition may be referred to as a fastigiate shoulder 660 in so much as the tapering, right circular cylinder 610 transitions to the right circular cone 630 which tapers to an apex 631. The process of the second etch has exposed a portion of the specific microstylet formerly within the apex 531 of the cone 530 of FIG. 5B. Thus, the microstylet 540, a portion 641 of which is secured mechanically within the conical shape 630 and coincident with the longitudinal axis 130 is formed. This is in contrast to that of the prior art in which a microstylet would be adhesively attached to a shank with a poor chance of being co-aligned with the shank longitudinal axis. Such a microprobe may be used as a field emitter, a micromanipulator or a microinjector in a variety of tools, e.g., scanning electron microscope, stylus nanoprofilometer, etc., or in laboratory procedures.

Therefore, a microprobe has been described as the present invention incorporating a microstylet, in the form of a single- or multi-walled nanotube, directly into the probe body itself and thereby eliminating any gluing or attachment of the microstylet to a probe body. It also aligns the microstylet directionally with respect to the central axis of the glass tube being used as a shank or probe body.

Although the present invention has been described in detail, those skilled in the art should understand that they can make various changes, substitutions and alterations herein without departing from the spirit and scope of the invention in its broadest form.

What is claimed is:

1. A probe, comprising:
   a probe body having a body longitudinal axis and a shoulder; and
   microstylets embedded in the probe body and having a longitudinal axis aligned along the body longitudinal axis, wherein one end of one of the microstylest is integrally bound to the probe body and another end extending from the shoulder, each of the microstylets having a cross section substantially smaller than a cross section of the probe body.

2. The probe as recited in claim 1 wherein the microstylets comprises an acerate microparticle selected from the group consisting of:
   a carbon whisker;
   a metal needle; and
   a diamond.

3. The probe as recited in claim 1 wherein the microstylets are single-walled carbon nanotubes or a multi-walled carbon nanotubes.

4. The probe as recited in claim 1 wherein the probe body comprises a tube.

5. The probe as recited in claim 1 wherein the probe body comprises a glass tube.

6. The probe as recited in claim 1 wherein a portion of the specific microstylet resides within the probe body.

7. The probe as recited in claim 1 wherein the shoulder includes a fastigiate shoulder.

8. The probe as recited in claim 1 wherein the probe is a field emitter, a micromanipulator or a microinjector.

9. The probe as recited in claim 1 wherein the microstylets are spaced apart along the body longitudinal axis.

10. A probe, comprising:
    a probe body having a body longitudinal axis and a shoulder; and
    carbon nanotubes embedded in the probe body and each having a longitudinal axis aligned alone the body longitudinal axis, wherein one end of one of the carbon nanotubes is integrally bound to the probe body and another end of the carbon nanotube extends outwardly from the shoulder, each of the carbon nanotubes having a cross section substantially smaller than a cross section of the probe body.

11. The probe as recited in claim 10 wherein the carbon nanotubes are single-walled carbon nanotubes or a multi-walled carbon nanotubes.

* * * * *